United States Patent [19]

Boerstler et al.

[11] Patent Number: 5,274,285

[45] Date of Patent: Dec. 28, 1993

[54] ENHANCED DIFFERENTIAL CURRENT SWITCH COMPENSATING UPSHIFT CIRCUIT

[75] Inventors: David W. Boerstler, Millbrook; Edward B. Eichelberger, Hyde Park; Gary T. Hendrickson, Kingston; Charles B. Winn, Hyde Park, all of N.Y.

[73] Assignee: International Business Machines Corporation, Armonk, N.Y.

[21] Appl. No.: 940,252

[22] Filed: Sep. 1, 1992

[51] Int. Cl.⁵ .................. H03K 19/092; H03K 19/086
[52] U.S. Cl. ..................................... 307/475; 307/455; 307/443
[58] Field of Search ..................... 307/475, 455, 443

[56] References Cited

U.S. PATENT DOCUMENTS

| | | | |
|---|---|---|---|
| 2,831,987 | 4/1958 | Jones | 307/279 |
| 3,875,432 | 4/1975 | Saia | 307/299 |
| 3,987,315 | 10/1976 | Matsue | 307/279 |
| 4,003,076 | 1/1977 | Polata et al. | 357/34 |
| 4,539,493 | 9/1985 | Varadarajan | 307/455 |
| 4,754,171 | 6/1988 | Dasai et al. | 307/455 |
| 4,926,065 | 5/1990 | Coy et al. | 307/475 |
| 4,942,316 | 7/1990 | Beranger et al. | 307/455 |
| 5,075,574 | 12/1991 | Boudon | 307/455 |
| 5,113,095 | 5/1992 | Huehne | 307/455 |
| 5,160,857 | 11/1992 | Barre | 307/475 |

*Primary Examiner*—Edward P. Westin
*Assistant Examiner*—Richard Roseen
*Attorney, Agent, or Firm*—Lawrence D. Cutter; Mark S. Walker

[57] ABSTRACT

A compensating upshift circuit providing low signal degradation and operating at high speed and at low power. Capacitor shunted diodes cross-couple the collectors and bases of two transistors. The cross-coupling eliminates signal swing degradation in the upshift circuit and controls current through the two collector resistors. Equalized collector resistor current eliminates signal swing degradation while providing an upshift circuit with short delays. The capacitor shunted diodes can be replaced by diode connected transistors configured to provide the necessary collector-base capacitance.

5 Claims, 2 Drawing Sheets

5,274,285

ENHANCED DIFFERENTIAL CURRENT SWITCH COMPENSATING UPSHIFT CIRCUIT

BACKGROUND OF THE INVENTION

1. Field of the Invention

The present invention relates generally to solid state digital logic circuits and particularly to bipolar, emitter coupled logic (ECL) circuits. Particularly, the invention relates to improvements to differential current switch (DCS) logic circuits and more particularly to apparatus for low power voltage shifting.

2. Background and Related Art

Digital logic circuits in current generation computers are frequently implemented as VLSI circuits. Bipolar emitter coupled logic (ECL) circuits predominate and are found in, for example, the IBM ES/9000 series of large computers.

Circuit designers are continually seeking to increase the speed of the logic circuits and to reduce the power consumed by such circuits. Power consumption is particularly critical in circuits having high logic density due to the resulting heat dissipation that must be removed by cooling apparatus.

Differential current switch logic (DCS) circuits have been proposed to increase circuit speed without an accompanying increase in power. Eichelberger et al. U.S. Pat. No. 4,760,289, (commonly assigned) for a "Two Level Differential Cascode Current Switch Masterslice" is an example of such a circuit and is incorporated by reference. The DCS circuit described in Eichelberger et al. improves switching speed by up to twenty percent without an increase in power.

DCS devices have been enhanced over the '289 design by incorporating a third cascode level and the circuitry necessary to provide input and output signals to each circuit level. The structure of an enhanced DCS (EDCS) circuit is shown in FIG. 1.

The output performance of most VLSI circuit technologies like EDCS is a strong function of the capacitive load or fanout of the output. The output stage 16 provides the circuitry to meet those output load requirements.

The addition of a third cascode level requires shifting of logic signals to a third level. Enhanced differential current switch logic according to the present invention is based on logic signals compatible with the middle cascode level with an upshift circuit 12 and downshift circuit 14 to adjust the signals for the other two levels. This operational principle simplifies logic design and allows use of the EDCS bookset with ECL Current Switch Emitter Follower signal levels.

SUMMARY OF THE INVENTION

The present invention is directed to an improved upshift circuit that provides an upshift function with minimal signal swing degradation for any bookset power. The upshift circuit of the present invention has small signal delays and requires little power.

The present invention provides a compensating circuit to control the current flowing in the upshift circuit. Current compensation is particularly important in high power circuits. The compensating circuit has two transistors whose emitters are coupled through a reference resistor to a reference voltage. The collectors of each transistor are connected through equal collector resistors to a collector voltage. The differential outputs are taken from the collector nodes. The base of each transistor is cross-coupled to the collector of the other transistor through a capacitor shunted diode and is connected to one of the differential inputs. The capacitor shunted diodes can be replaced by diode connected transistors connected to utilize the effective base-collector capacitance and eliminate the need for discrete capacitors. The compensating circuit equalizes the current flow through the diodes and reduces signal swing degradation.

It is therefore an object of the invention to provide an upshift circuit with constant diode current flows.

It is a further object of the invention to provide an upshift circuit with low signal swing degradation.

It is yet another object of the present invention to provide an upshift circuit with low power consumption.

It is yet another object of the present invention to provide a high speed upshift circuit that rapidly shifts the voltage without signal delays.

It is still another object of the invention to provide an upshift circuit with AC coupling.

The foregoing and other objects, features and advantages of the invention will be apparent from the following more particular description of a preferred embodiment of the invention, as illustrated in the accompanying drawing wherein like reference numbers represent like parts of the invention.

DETAILED DESCRIPTION

The enhanced differential current switch logic family provides the basis for computer logic designs for computers such as the IBM ES/9000 series. This logic family is implemented using VLSI technology to provide a set of logic building blocks. The basic VLSI design approach is based on a number of cells that can be "wired" in different ways to provide a set of "books" of basic logic function. Logic functions can be 'AND', 'OR' and so forth (see Eichelberger et al. above.)

Figure 1:
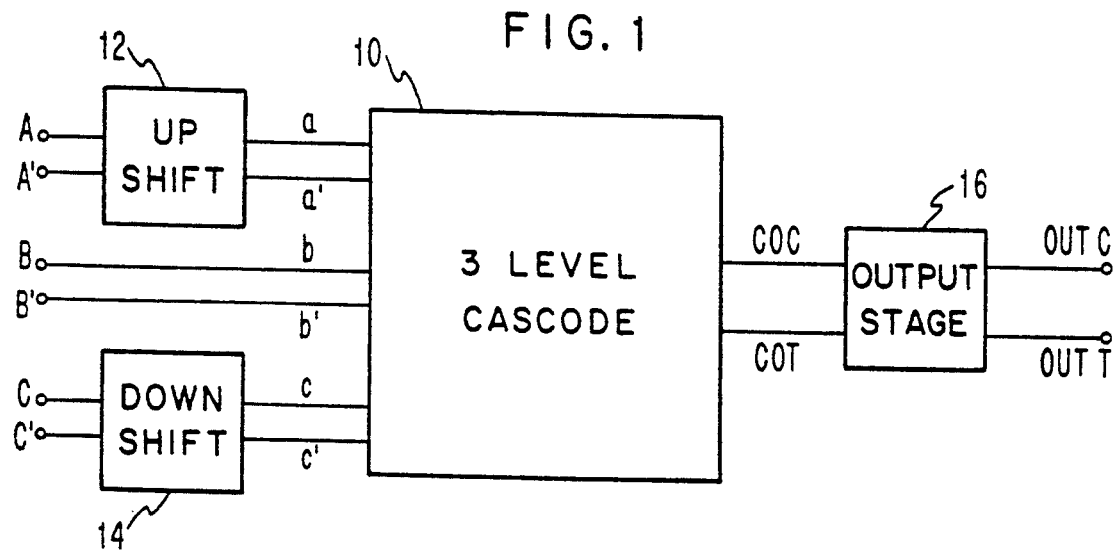
FIG. 1 is a block diagram of an enhanced differential current switch logic circuit according to the present invention.

The enhanced differential current switch shown in FIG. 1 has the advantage of having a third input level increasing the logic fan-in and function producible with that circuit.

EDCS is designed to work with existing emitter coupled logic (ECL) components. As such, it must provide appropriately loaded output signals and be able to accept inputs from ECL components. This is accomplished by maintaining input and output levels compatible with ECL current switch emitter follower (CSEF) levels. All signals are provided at the middle cascode level and must be up-shifted or down-shifted for the upper or lower cascode levels.

The basic structure of an EDCS circuit employing the present invention is shown in FIG. 1. Three level cascode logic 10 provides the basic logic of the device. Logic 10 can implement an OR, XOR, AND or similar logic function. The inputs to the EDCS circuit are A, A′, B, B′, C, C′ (where A and A′ is a differential pair and A′ is the complement of A). Inputs A,A′ are up-shifted by up-shift circuit 12 and inputs C, C′ are down-shifted by down-shift circuit 14 to provide the necessary voltage to the cascode logic 10. Outputs COC and COT flow through output stage 16 to provide the outputs OUTC and OUTT with the necessary current to drive the capacitive load the following logic circuit.

Figure 2:
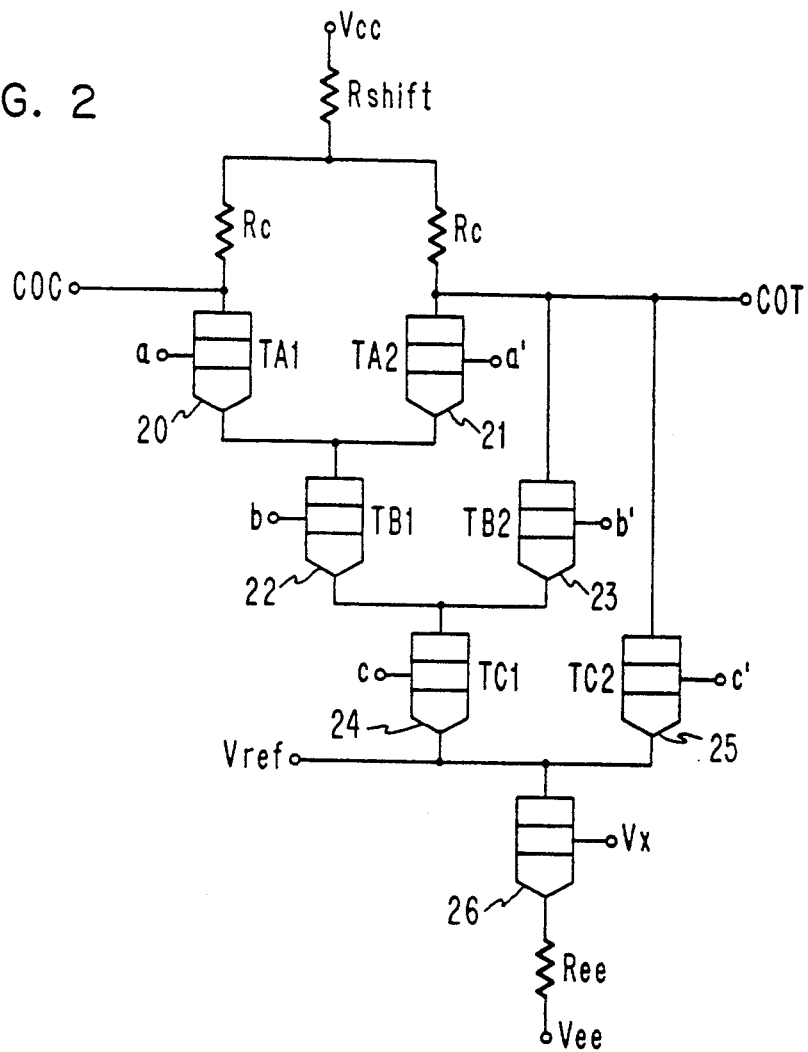
FIG. 2 is a circuit diagram illustrating an 'AND' circuit implemented using three level cascode EDCS logic.

FIG. 2 is an example of three level cascode logic that can be used with the present invention. FIG. 2 represents an 'AND' logic circuit, although EDCS can be used to provide any logic function of three variables.

In the preferred embodiment as illustrated by FIG. 2, the differential inputs are at the following levels: a/a′ 1.1/0.9 V; b/b′ 0.3/0.1 V; and c/c′ −0.5/−0.7 V. The supply voltage, $V_{cc}$, is 1.4 V, $V_{ee}$ is 2.2 V, and $V_x$ is −0.8 V. The outputs COT/COC are 1.1/0.9 V and are connected to the output stage 16. Output stage 16 drops the output level of OUTT/OUTC to 0.3/0.1 V, the level compatible with the middle stage of the next circuit. $R_{shift}$ provides a constant 300 mV drop down from $V_{cc}$. The operation of the logic circuit Will not be further described as it does not form part of the present invention. This AND circuit provides the logic function OUTT=A AND B AND C.

Figure 3:
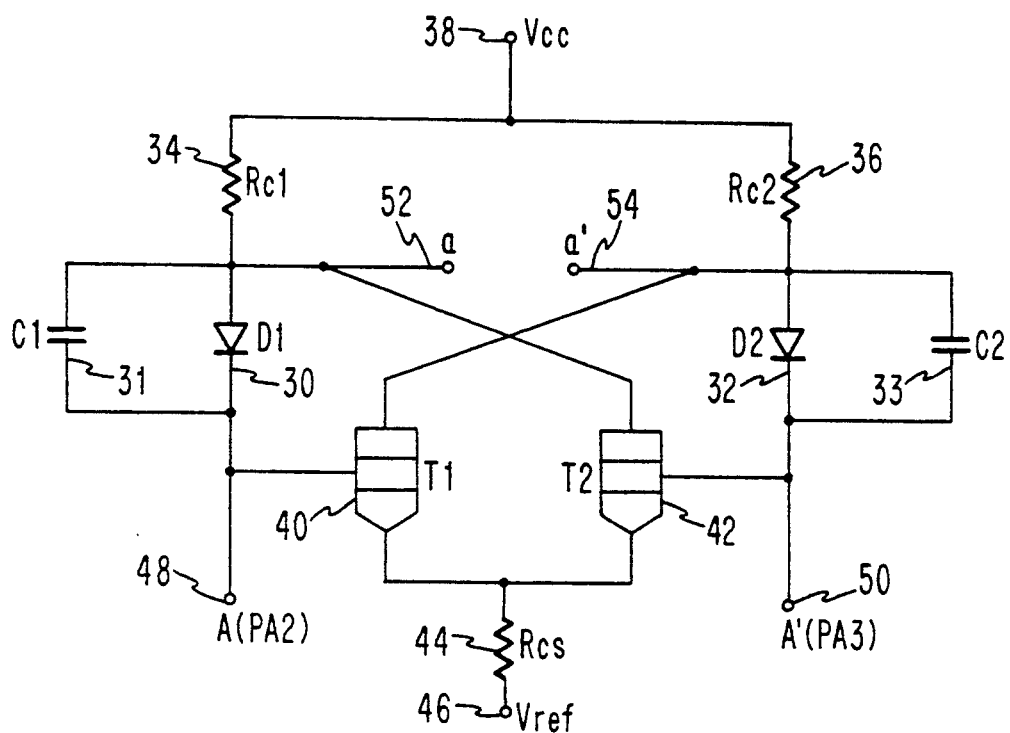
FIG. 3 is a circuit diagram depicting a compensating upshift circuit according to the present invention.

A circuit diagram of an upshift circuit according the preferred embodiment of the present invention is shown in FIG. 3. Capacitor shunted diodes 30 and 32 (shunted by capacitors 31 and 33 respectively) are connected in series with collector resistors 34 and 36 to common collector voltage potential $V_{cc}$ 38 and to cross-coupled transistors T1 40 and T2 42 that form a differential pair. The emitters of the differential pair are connected through current controlling resistor $R_{cs}$ 44 to reference voltage $V_{ref}$ 46.

PA2 48 and PA3 50 are the differential inputs shown as A and A′ in FIG. 1 and typically have values of 0.3 V and 0.1 V. Output is taken from the collectors of the transistors providing output signals a 52 and a′ 54 that are the inputs to the upper cascode stage.

The capacitance of C1 31 and C2 33 must be large compared to the effective input capacitance of TA1 20 and TA2 21 to minimize the signals swing degradation due to capacitive voltage division. The high speed through the upshift is due to the AC coupling through the diode capacitance. If the load capacitance is large, the signal will deteriorate due to capacitive voltage division between the load capacitance and the upshift capacitance. Minimal degradation requires the load capacitance to be very small compared to the upshift capacitance so that the voltage across the load capacitance is essentially equal to the voltage from the previous stage.

The resistor $R_{cs}$ 44 connected to the emitters of T1 40 and T2 42 approximates a current source. When PA2 48 is high and PA3 50 is low, the current through collector resistor $R_{c1}$ 34 will consist of the current through D1 30 plus the base current into T1 40, while the current through resistor $R_{c2}$ will consist of the current through D2 32 plus the collector current of T1 40 which is the constant current through $R_{cs}$. The current through $R_{cs}$ 44 in the preferred embodiment is equal to the sum of the base current of TA1 (20 FIG. 2) plus $V_{diff}/R_c$, where $R_c=R_{c1}=R_{c2}$, and $V_{diff}$ is the difference between the input voltages A 48 and A′ 50 (in the preferred embodiment is 200 mV.) Setting the current of $R_{cs}$ 44 at this level equalizes the current through the diodes 30 32 thereby minimizing signal swing degradation. The currents through the diodes 30 32 change very little when the input changes polarity effectively compensating the signal swing reduction due to the base current load of the following stage and the current variation due to the signal swing and the value of $R_c$.

Figures 4A, 4B, 4C:
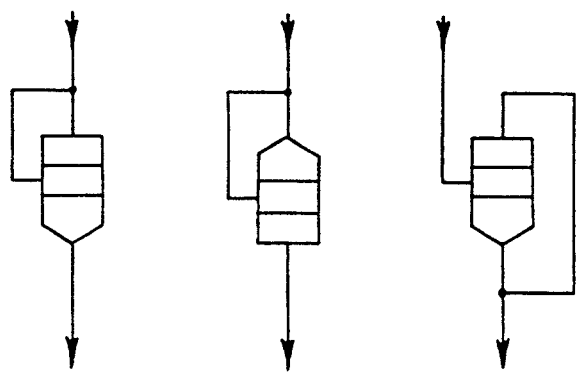
FIG. 4(a)–4(c) are example configurations of diode connected transistors that provide the necessary capacitance in alternate embodiments of the present invention.

The present invention increases the design flexibility in selecting values for $R_{c1}$, $R_{c2}$, D1/D2, and C1/C2 over standard upshift circuits since signal swing degradation is reduced. Resistor values $R_c$ are chosen large enough so that the current flowing back into the previous stage is not sufficient to cause limited fanout capability due to loading effects, while maintaining enough current to keep the diodes properly biased and sufficient current available for TA1/TA2 20 21. The compensation of the signal swing reduction allows use, in the preferred embodiment, of diode connected transistors as shown in FIG. 4(c) with those devices having larger capacitance and fewer capacitive voltage division effects.

The preferred embodiment of the present invention is implemented using diode connected transistors connected to increase the effective capacitance between the base and collector nodes thereby eliminating the need for discrete capacitors. FIGS. 4(a)–4(c) illustrate alternate configurations of diode connected transistors for use with the present invention. FIG. 4(a) illustrates a commonly found configuration with low $C_{cb}$ which is ideal for applications where it is being switched. FIGS. 4(b) and 4(c) illustrate configurations well suited for level shifting applications due to $C_{cb}$ values two to three orders of magnitude higher than those of FIG. 4(a) (higher $C_{cb}$ values are found at high currents.) The device of FIG. 4(b) has a lower junction voltage than that of FIG. 4(c) but its capacitance is also substantially lower.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

We claim:

1. A level shift circuit for translating a pair of differential voltages from a first voltage level to a second higher voltage level, said circuit comprising:

two differentially connected transistors wherein the emitters of each of said transistors are coupled to a common current source;

two resistors connected to a common collector supply voltage;

high capacitance diode means connected in series with each of said resistors to the base of each of said transistors, wherein the collector of a first of said two transistors is cross-coupled to the node connecting said resistor and said diode means connected to the base of a second of said two transistors and the collector of said second of said two transistors is cross-coupled to the node connecting said resistor and said diode means connected to the base of said first transistor;

input means for receiving a first and second differential input voltage, said input means connecting said first differential input voltage to the base of said first transistor and said second differential input voltage to the base of said second transistor; and first and second output means for providing differential voltage output said output means connected to said node connecting said resistors to said diode means.

2. The level shift circuit of claim 1, wherein said high capacitance diode means are formed by diode-connected transistors.

3. A level shift circuit for translating a pair of differential voltage inputs from a first voltage level to a second voltage level, said circuit comprising:
- a first and second bipolar transistor, each having a base, emitter and collector;
- a first and second resistor respectively connected to the collector of said first and second transistors and commonly connected to a voltage source;
- a third resistor commonly connected to the emitters of said first and second transistors and to a current source;
- first and second high capacitance diode means for controlling current cross-connected between the collector of one and base of the other of said first and second transistors and in electrical series with said first and second resistors;
- first and second input means for receiving first and second differential signals, said first and second input means connected to the base of said first and second transistors, respectively;
- first and second output means for providing first and second differential output signals, said first and second output means connected to the node joining said resistor and said high capacitance diode means of said first and second transistor.

4. The circuit of claim 3 wherein said first and second high capacitance diode means are each a transistor biased so that the collector-base junction of said transistor is forward biased and said second voltage level is taken from said collector lead.

5. A level shift circuit for translating a differential pair from a first voltage level to a second voltage level, said circuit comprising:
- two bipolar transistors;
- a resistor connected to the collector of each of said transistors;
- a common emitter current source connected to the emitters of said transistors;
- high capacitance diode means for interconnecting said resistor of one of said transistors and said base of the other of said transistors;
- said first voltage level pair connected to said base of said transistors and said second voltage level pair appearing at said collector leads.

* * * * *